United States Patent
Hayashi et al.

(10) Patent No.: US 7,230,202 B2
(45) Date of Patent: Jun. 12, 2007

(54) PLASMA PROCESSING APPARATUS, ELECTRODE UNIT, FEEDER MEMBER AND RADIO FREQUENCY FEEDER ROD

(75) Inventors: Daisuke Hayashi, Nirasaki (JP); Kazuya Nagaseki, Nirasaki (JP); Shinji Himori, Nirasaki (JP); Atsushi Matsuura, Nirasaki (JP); Ryo Nonaka, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/927,587

(22) Filed: Aug. 27, 2004

(65) Prior Publication Data

US 2005/0023254 A1 Feb. 3, 2005

(51) Int. Cl.
B23K 9/00 (2006.01)

(52) U.S. Cl. .......................... 219/121.43; 156/345.44; 315/111.21

(58) Field of Classification Search ........... 219/121.43, 219/121.4, 121.55, 121.56; 156/345.44, 156/345.47, 345.51; 118/500, 723 E, 723 VE, 118/724; 315/111.21, 111.41; 427/569; 216/67, 71

See application file for complete search history.

(56) References Cited

U.S. PATENT DOCUMENTS

| 5,443,689 A | * | 8/1995 | Kimura et al. | 216/63 |
| 5,609,691 A | * | 3/1997 | Yamamori | 118/723 E |
| 5,900,103 A | * | 5/1999 | Tomoyasu et al. | 156/345.44 |
| 5,914,568 A | * | 6/1999 | Nonaka | 315/111.21 |

FOREIGN PATENT DOCUMENTS

| JP | 02-035722 | 2/1990 |
| JP | 03-107484 | 5/1991 |
| JP | 2000-315679 | 11/2000 |
| JP | 2002-025919 | 1/2002 |

OTHER PUBLICATIONS

International Preliminary Examination Report (PCT/IPEA/409 and PCT/IPEA/416) (in Japanese) issued for PCT/JP03/02381.
Notification of Receipt of Record Copy (PCT/IB/301) issued for PCT/JP03/02381.
Notification Concerning Submission or Transmittal of Priority Document (PCT/IB/304) issued for PCT/JP03/02381.
Form PCT/IPEA/401 (in Japanese) issued for PCT/JP03/02381.
PCT Publication No. WO 03/073489 with International Search Report (PCT/ISA/210) issued for PCT/JP03/02381.
Letter dated Aug. 24, 2004 enclosing a Notification of Change of Name in connection with PCT/JP03/02381.
Notification of the Recording of a Change (PCT/IB/306) issued for PCT/JP2003/002381, mailed Aug. 27, 2004.
Notification of Transmittal of Copies of Translation of the International Preliminary Examination Report (PCT/IB/338) issued for PCT/JP2003/002381 (Jul. 1996).
International Preliminary Examination Report (PCT/IPEA/409) issued for PCT/JP2003/002381, (Jul. 1998).

* cited by examiner

*Primary Examiner*—Quang Van
(74) *Attorney, Agent, or Firm*—Smith, Gambrell & Russell, LLP

(57) ABSTRACT

Disclosed herein is a plasma processing apparatus that introduces a process gas into an airtight processing container, that applies a radio frequency power to generate plasma, and that conducts a plasma process to an object to be processed arranged in the processing container. The plasma processing apparatus includes: an electrode unit arranged in the processing container, the electrode unit having an electrode for applying the radio frequency power, and a space portion arranged in the electrode unit, the space portion insulating the electrode and the processing container from each other. The space portion communicates with atmospheric air outside the processing container.

25 Claims, 5 Drawing Sheets

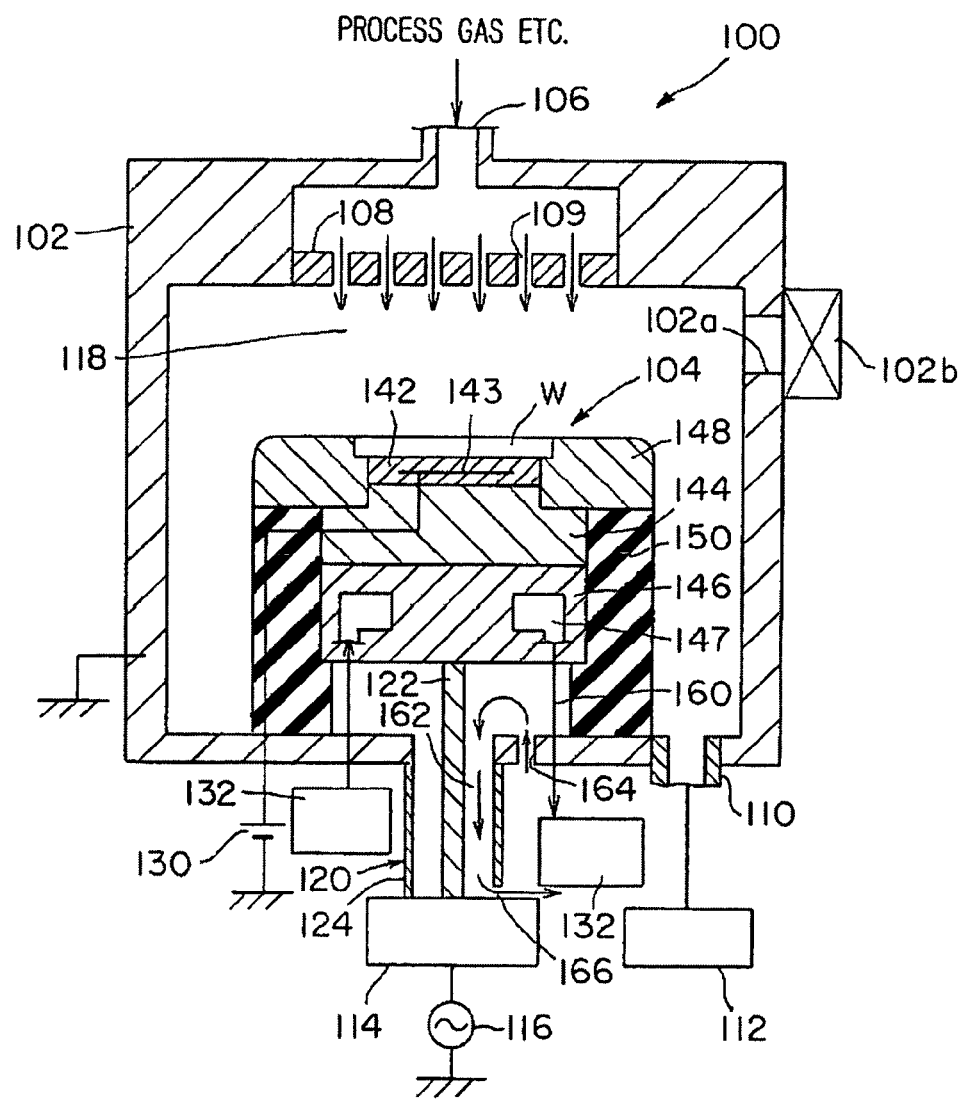
F I G. 1

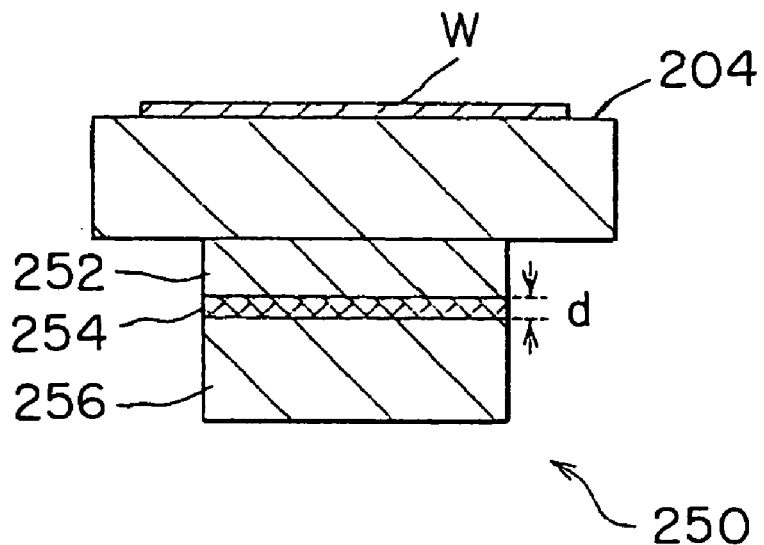
F I G. 4
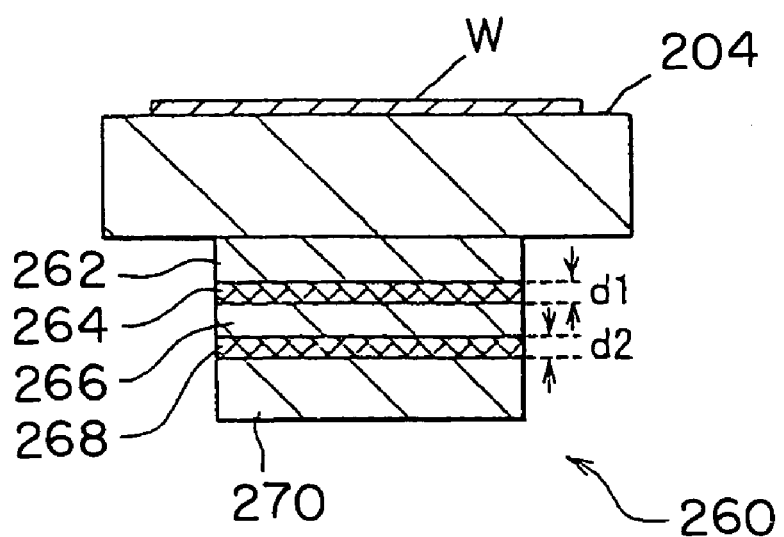
F I G. 5

PLASMA PROCESSING APPARATUS, ELECTRODE UNIT, FEEDER MEMBER AND RADIO FREQUENCY FEEDER ROD

FIELD OF THE INVENTION

The present invention relates to a plasma processing apparatus wherein a radio frequency power is applied to an electrode in a processing container to conduct a plasma process, and to an electrode unit.

DESCRIPTION OF THE RELATED ART

In a plasma process conducted in a manufacturing process of a semiconductor device or a manufacturing process of a liquid crystal display, a process gas is introduced into an airtight processing container in which an electrode is provided, a radio frequency power is applied to the electrode, and the process gas is made into plasma. By means of the plasma, a predetermined process such as an etching process or a film-forming process is conducted to a surface of an object to be processed.

In the plasma processing apparatus that carries out the process, for example at a lower portion of the processing container, an electrode unit is arranged, which also serves as a table for the object to be processed. At an upper portion of the electrode unit, a placing part on which the object to be processed is placed and an electrode part to which the radio frequency power is applied are arranged. A base plate provided at a lower portion of the electrode unit is grounded and forms a counter electrode to the electrode part. Thus, it is necessary to arrange an insulating member of a high dielectric strength between the electrode part and the base plate in order to insulate them from each other.

FIG. 8 is a schematic sectional view of a conventional electrode unit 10. As shown in FIG. 8, the electrode unit 10 comprises: an electrode part 12 to which a radio frequency power is supplied; a wafer-placing part 16 onto which a semiconductor wafer as an object to be processed is placed via a electrostatic chuck 15; a focus ring 14 provided around the placing part 16, a based plate 30, and the like.

A feeder unit that supplies the radio frequency power to the electrode part 12 is provided to penetrate the base plate 30 from a lower portion thereof. The feeder unit has an RF feeder rod 22 that is connected to the electrode part 12 to impress the radio frequency power, and an outside tube 20 that is grounded.

Between the electrode part 12 and the base plate 30, for the purpose of insulation, an insulating member 24 that consists of for example quartz or ceramics is provided.

SUMMARY OF THE INVENTION

However, the quartz or the ceramics for forming the insulating member 24 is generally large, expensive and difficult to process. Thus, manufacture or replacement of the insulating member 24 has a cost problem. In addition, when the insulating member 24 is replaced, the focus ring 14 above it or the like has to be removed, too. In addition, although the insulating member 24 insulates the electrode part 12 and the base plate 30 from each other, the insulating effect may not be enough, so that a part of the radio frequency power applied to the electrode part 12 may flow to the base plate 30 through the insulating member 24.

This invention is developed by focusing the aforementioned problems of the conventional plasma processing apparatus and the conventional electrode unit. An object of the present invention is to provide an electrode unit that can sufficiently restrain loss of a radio frequency power at low cost, and to provide a plasma processing apparatus including the electrode unit.

The present invention is a plasma processing apparatus that introduces a process gas into an airtight processing container, that applies a radio frequency power to generate plasma, and that conducts a plasma process to an object to be processed arranged in the processing container, the plasma processing apparatus comprising: an electrode unit arranged in the processing container, the electrode unit having an electrode for applying the radio frequency power; and a space portion arranged in the electrode unit, the space portion insulating the electrode and the processing container from each other; wherein the space portion is communicated with an atmospheric air outside the processing container.

Alternatively, the present invention is an electrode unit arranged in an airtight processing container of a plasma processing apparatus, the plasma processing apparatus introducing a process gas into the processing container and applying a radio frequency power to conduct a plasma process to an object to be processed, the electrode unit comprising: an electrode to which the radio frequency power is impressed; and a space portion that insulates the electrode and the processing container from each other; wherein the space portion is communicated with an atmospheric air outside the processing container.

According to the present invention, since the space portion that is an air layer is provided between the electrode and the processing container instead of quartz or ceramics used as a conventional insulating member, energy loss of the radio frequency power can be restrained.

In addition, as an insulating member, it is unnecessary to use quartz, ceramics and the like that are large in size and difficult to process. Thus, the cost for manufacture and replacement of the insulating member becomes unnecessary, and a lightweight electrode unit and plasma processing apparatus with high insulation properties can be provided.

In addition, since the space portion in the electrode unit is communicated with the atmospheric air outside the processing container, heat that stays at the space portion may be discharged outside the processing container at least by means of natural convection. In addition, the pressure in the space portion becomes substantially the same as the atmospheric air outside the processing container, so that abnormal electric discharge in the space portion is prevented.

Herein, it is preferable that an oxide layer is formed on a surface of the electrode at least on the side of the space portion. Alternatively, it is preferable that an oxide layer is formed on a surface of the processing container at least on the side of the space portion.

In addition, preferably, the plasma processing apparatus further comprises a feeder unit projected from an outside surface of the processing container, the feeder unit supplying the radio frequency power to the electrode of the electrode unit, the feeder unit has an impressing member for impressing the radio frequency power and a ground member surrounding the impressing member, the impressing member being connected to the electrode, the ground member being electrically connected to the processing container, a hollow portion is formed between the impressing member and the ground member, and the hollow portion is communicated to the space portion in the electrode unit. In the case, heat in the space portion of the electrode unit can be effectively discharged.

More preferably, the feeder unit has a communication channel from the hollow portion in the feeder unit to the atmospheric air outside the processing container. In the case, heat in the hollow portion of the feeder unit can be also effectively discharged. That is, in the case, the heat in the space portion of the electrode unit and in the hollow portion of the feeder unit can be discharged outside the processing container by means of natural convection through the communication channel of the space portion, the space portion of the electrode unit, the hollow portion of the feeder unit and the communication channel of the feeder unit. Thus, the inside of the feeder unit, at which heat tends to stay, can be effectively cooled.

For example, the ground member may be connected to a matching unit, and the communication channel may be provided in a vicinity of a connection part of the matching unit and the ground member.

In addition, a cooling-medium circulating unit that circulates a cooling medium through the electrode of the electrode unit to cool it may be provided. If the cooling-medium circulating unit for cooling the electrode part is provided, dew formation tends to be caused on a surface of an impressing member in the space portion of the electrode unit or a surface of the processing container. However, the dew formation may be prevented if the natural convention is generated in the space portion of the electrode unit and in the hollow portion of the feeder unit for discharging the heat outside the processing container.

In addition, an air circulating unit that circulates the atmospheric air outside the processing container through the space portion of the electrode unit and the hollow portion of the feeder unit may be provided. Thus, the effect of cooling the inside of the feeder unit and the effect of preventing the dew formation in the space portion of the electrode unit or the like can be enhanced more.

In addition, an object of the present invention is to provide a noble and improved plasma processing apparatus and feeder member thereof wherein a radio frequency power is efficiently transferred and wherein heat transfer can be stopped.

The present invention is a feeder member arranged in a plasma processing apparatus; the plasma processing apparatus introducing a process gas into an airtight processing container, applying a radio frequency power to generate plasma of the process gas, and conducting a plasma process to an object to be processed; the feeder member electrically connecting a radio frequency power source that generates the radio frequency power and an electrode to which the radio frequency power is impressed; the feeder member comprising a first member made of a conductive material, and a second member interposed in the first member and made of a dielectric material.

According to the invention, the first member made of a conductive material is directly connected to the radio frequency power source and the electrode, and the second member made of a dielectric material, whose thermal conductivity is low, is interposed in the first member, so that the electric power can be efficiently transferred and the heat transfer can be stopped.

Preferably, the second member is interposed in the first member as a layer.

In addition, preferably, the second member is made of any of alumina ceramics, bulk yttria or zirconia.

In addition, the present invention is a plasma processing apparatus that introduces a process gas into an airtight processing container, that applies a radio frequency power to generate plasma of the process gas and that conducts a plasma process to an object to be processed, wherein a feeder unit having the above features is provided.

In addition, an object of the present invention is to provide a radio frequency feeder rod that can prevent a heated state thereof by enhancing cooling efficiency thereof.

The present invention is a radio frequency feeder rod that is used for supplying a radio frequency power and that has a flow path of cooling-medium therein, the radio frequency feeder rod comprising an expanding unit that expands an area of absorption of heat by the cooling medium.

Alternatively, the present invention is a radio frequency feeder rod that is used for supplying a radio frequency power to an electrode when a plasma process is conducted to an object to be processed and that has a flow path of cooling-medium therein, the radio frequency feeder rod comprising an expanding unit that expands an area of absorption of heat by the cooling medium.

For example, the expanding unit may consist of a plurality of flow paths that extend in parallel. Alternatively, the expanding unit may comprise a plurality of protrusions that protrude into the flow path of cooling-medium. In the case, for example, the protrusion may be finlike formed in an axial direction.

BRIEF DESCRIPTION OF THE DRAWINGS

FIG. 1 is a schematic sectional view of a plasma etching apparatus according to an embodiment of the present invention;

FIG. 4 is a schematic sectional view showing a feeder member of FIG. 3;

FIG. 5 is a schematic sectional view showing another embodiment of a feeder member;

DESCRIPTION OF THE PREFERRED EMBODIMENT

Hereinafter, preferred embodiments of a plasma processing apparatus according to the present invention will be described in detail with reference to the attached drawings. In the specification and the drawings, elements that have substantially the same structure and function are represented by the same numeral sign, and overlapped explanation is omitted.

Figure 2:
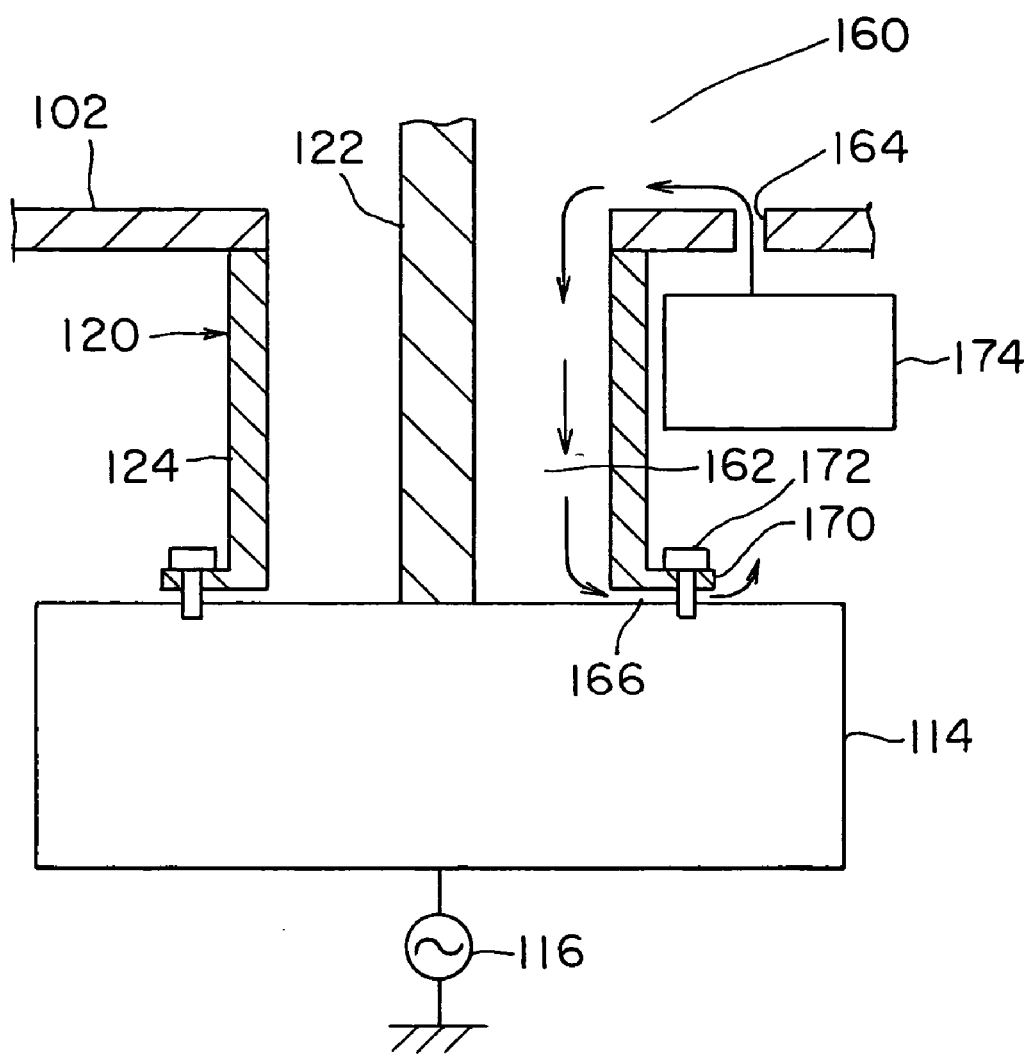
FIG. 2 is a schematic sectional view of a feeder unit of FIG. 1 and the vicinity thereof.

FIG. 1 is a schematic sectional view of a plasma etching apparatus 100 of the embodiment. FIG. 2 is a partial sectional view of the plasma etching apparatus 100. As shown in FIG. 1, the plasma etching apparatus 100 includes an airtight processing container 102, which is for example substantially cylindrical and grounded. At a lower portion in the processing container 102, a lower electrode unit 104 as an example of an electrode unit is provided. The lower electrode unit 104 also serves as a table on which a semiconductor wafer W is placed.

Between the semiconductor wafer W and the lower electrode unit 104, a heat-transfer gas (for example, an He gas) is adapted to be supplied at a predetermined pressure from a heat-transfer-gas supplying mechanism (not shown). Thus, heat of the lower electrode unit 104 can be transferred to the semiconductor wafer W, so that the temperature of the semiconductor wafer W can be suitably controlled.

An upper electrode plate 108 is provided at an upper portion of the processing container 102 to confront the lower electrode unit 104. The upper electrode plate 108 is grounded via the processing container 102. A plurality of gas-ejecting ports 109 is provided at the electrode plate 108.

A gas introducing port 106 connected to a gas-introducing system (not shown) is provided at an upper portion of the processing container 102. The process gas introduced from the gas introducing port 106 is introduced into the processing container 12 through the gas-ejecting ports 109 of the upper electrode plate 108. As a process gas, for example, a $C_4F_6$ gas, a mixed gas of an Ar gas and an $O_2$ gas, and the like may be used.

An opening 102a is provided at the processing container 102 for conveying the semiconductor wafer W into or out from the processing container 102. A gate valve 102b that can hermetically open and close is provided outside the opening 102a. Through the gate valve 102b, the semiconductor wafer W is conveyed into or out from the processing container 102, for example by means of a conveying unit of a load-lock chamber not shown.

An exhaust pipe 110 connected to an exhaust unit 112 is communicated to a lower portion of the processing container 102. A plasma process space 118 in the processing container 102 can be maintained at a predetermined vacuum level by vacuuming the plasma process space 118 via the exhaust pipe 110 by means of the exhaust unit 112. Magnets may be provided outside the both side walls of the processing container 102 so as to generate a magnetic field perpendicular to an electric field generated in the processing container 102. In the case, it is preferable that the strength of the magnetic field by the magnets is changeable.

The lower electrode unit 104 is connected to a radio frequency power source 116 via a matching unit (matching box) 114. The frequency of the radio frequency power source 116 is for example 13.56 MHz. The frequency may be not less than 100 MHz. By means of the electric power given by the radio frequency power source 116, the process gas introduced into the plasma process space 118 is made plasma, so that an etching process is conducted to the semiconductor wafer W.

Herein, an operation of conducting an etching process by using the plasma etching apparatus 100 is explained. At first, a semiconductor wafer W is placed onto the lower electrode unit 104 in the processing container 102. Then, via the exhaust pipe 110, the inside of the processing container 102 is exhausted to a predetermined vacuum level or less by the exhaust unit 112. After that, a predetermined process gas is introduced at a predetermined flow rate from the gas-introducing port 106 into the processing container 102 via the gas-ejecting ports 109, so that the inside of the processing container 102 is adjusted to a predetermined vacuum level.

Then, a radio frequency power of for example 13.56 MHz is applied from the radio frequency power source 116 to the lower electrode unit 104 via the matching unit 114. Thus, the process gas is made plasma in the plasma process space (first space portion) 118, so that a predetermined etching process is conducted to a surface of the semiconductor wafer W.

Next, a detailed structure of the lower electrode unit 104 of the embodiment is explained with reference to FIGS. 1 and 2. As shown in FIG. 1, the lower electrode unit 104 comprises; a placing part 144 onto which the semiconductor wafer W is placed via a electrostatic chuck 142, and an electrode part 146 that supports a lower portion of the placing part 144. The placing part 144 and the electrode part 146 form a lower electrode.

In addition, the lower electrode unit 104 comprises: a circular focus ring 148 provided to surround the semiconductor wafer W, and a side insulating member 150 provided to surround the placing part 144 and the electrode part 146.

The electrostatic chuck 142 is formed by interposing a conductive layer 143 in an insulator consisting of ceramics, polyimide film, or the like. A direct-current voltage is adapted to be impressed to the conductive layer 143 from a high-voltage direct-current source 130 provided outside the processing container 102 via a lead wire. When the direct-current voltage is applied from the high-voltage direct-current source 130 to the conductive layer 143, the semiconductor wafer W is stuck to the electrostatic chuck 142 by coulomb attraction.

The focus ring 148 is arranged above the placing part 144. The focus ring 148 is made of for example silicon or quartz, and has a function of causing ions in the plasma to effectively go into the semiconductor wafer W. In addition, a step-portion formed at an inner upper surface of the focus ring 148 helps the semiconductor wafer W to be placed on a predetermined position.

The radio frequency power is applied from the radio frequency power source 116 to the electrode part 146 via the matching unit 114. Since the electrode part 146 and the placing part 144 contact with each other, the radio frequency power applied to the electrode part 146 is supplied to the placing part 144. The placing part 144 and the electrode part 146 are made of aluminum or the like in common.

As described above, if the lower electrode is separately formed into the placing part 144 and the electrode part 146, at a maintenance operation, only the placing part 144 can be replaced while a feeder rod for supplying the radio frequency power to the electrode part 146 (described below) continues to be connected. That is, at a maintenance operation, it is unnecessary to pull or insert the feeder rod, so that it is easy to conduct the maintenance operation. Of course, the lower electrode may be integrally formed, instead of separately formed into the placing part 144 and the electrode part 146.

A cooling room 147 such as a cooling jacket is formed in the electrode part 146. By means of a cooling-medium circulating unit 132, a cooling medium is introduced into the cooling room 147 through a cooling-medium introducing pipe and is discharged therefrom through a cooling-medium discharging pipe. That is, the cooling medium is circulated in the cooling room 147 by means of the cooling-medium circulating unit 132.

The side insulating member 150 is a member for securely insulating the lower electrode consisting of the placing part 144 and the electrode portion 146 from a bottom portion of the processing container 102 that is grounded. The side insulating member 150 is made of for example quartz or the like. The side insulating member 150 supports the focus ring 148, the placing part 144 and the electrode part 146. In addition, the side insulating member 150 also plays a role of forming a space portion (second space portion) 160, which is the feature of the invention, between the electrode part 146 and the processing container 102.

Specifically, the side insulating member 150 is attached onto the bottom portion of the processing container 102. A step-portion is formed on an inner side of the side insulating member 150. The inner diameter at a lower portion with respect to the step-portion is smaller than the inner diameter at an upper portion with respect to the step-portion. In addition, a lower end portion of the electrode part 146 is supported by the step-portion. Thus, the space portion 160 is formed on the inner side of the lower portion of the side insulating member 150, and the placing part 144 and the electrode portion 146 are insulated from the processing container 102. In addition, the space portion 160 is divided from the plasma process space 118 in the processing container 102, in which the plasma process is conducted, by the side insulating member 150.

In addition, a communication channel (first communication channel) 164 that communicates with the space portion (second space portion) 160 and the atmospheric air outside the processing container 102 is formed at a bottom portion of the processing container 102. Thus, heat that stays at the space portion 160 can be discharged outside the processing container 102 through the communication channel 164, at least by means of natural convection.

Thus, as the space portion (second space portion) 160 that is an air layer is provided between the processing container and the lower electrode consisting of the placing part 144 and the electrode part 146, instead of quartz and/or ceramics provided as a conventional insulating member, energy loss of the radio frequency power can be restrained. In addition, the cost for manufacture and replacement of the insulating member becomes unnecessary, so that the electrode unit and the plasma processing apparatus can be provided at a low cost.

Especially, since a dielectric constant of the atmospheric air (about 1) is lower than that of any low dielectric material, the above structure is optimal to prevent the loss of the radio frequency power. That is, the effect of communication of the space portion (second space portion) 160 with the atmospheric air is remarkable. On the other hand, the withstand voltage of quartz, ceramics or the like is 10 to 50 kV/mm, but that of the atmospheric air is 1 kV/mm, which is very small. However, if the thickness of the space portion 160 is designed so as not to cause an insulation breakdown by taking into consideration that the voltage difference applied to the space portion 160 is several kV, it is possible to secure an enough withstand voltage. In addition, the capacitance of the lower electrode unit 104 can be designed to be the same as a case using an insulating member such as quartz, ceramics or the like.

Herein, the feeder unit 120 for supplying the radio frequency power to the electrode part 146 is explained. The feeder unit 120 is provided to project from a bottom surface of the processing container 102. The feeder unit 120 comprises: an RF feeder rod 122 as an example of an impressing member that is connected to the electrode part 146 of the lower electrode to impress the radio frequency power, and an outside tube 124 as an example of a grounding member that is provided to surround the RF feeder rod 122.

One end of the RF feeder rod 122 penetrates the space portion 160 of the lower electrode unit 104 to be connected to the electrode part 146. The other end of the RF feeder rod 122 is connected to the matching unit 114. One end of the outside tube 124 is connected to an edge portion of a hole formed at a bottom portion of the processing container 102, that is, grounded. The other end of the outside tube 124 is connected to the matching unit 114. Thus, the RF feeder rod 122 and the outside tube 124 are connected via the matching unit 114, so that an electrical loop is formed.

The RF feeder rod 122 and the outside tube 124 are made of a low-resistance conductive material, such as silver or copper, in order to supply the radio frequency power efficiently. For example, if they are made of copper, the surfaces thereof may be silver plated.

A hollow portion (third space portion) 142 is formed between the RF feeder rod 122 and the outside tube 124. The hollow portion 162 is communicated with the space portion (second space portion) 160 of the lower electrode unit 104. In the vicinity of the connecting part of the hollow portion 162 and the matching unit 114, a communication channel (second communication channel) 166 is formed for communicating the hollow portion 162 with the atmospheric air outside the processing container 102.

Then, when heat accumulates at the space portion 160 of the lower electrode unit 104 and at the hollow portion 162 of the feeder unit 120, the heat can be discharged outside the processing container 102 by means of natural convection of the air through the communication channel 164 of the space portion 160, the space portion 160 of the lower electrode unit 104, the hollow portion 162 of the feeder unit 120, and the communication channel 166 of the feeder unit 120. Thus, the inside of the feeder unit 120, at which the heat tends to stay especially, can be cooled. The air flow through the space portion 160 of the lower electrode unit 104 and the hollow portion 162 of the feeder unit 120 may be opposite to that shown in FIG. 1.

In addition, the communication channel 166 may be provided by forming a hole in the outside tube 124. Alternatively, a hole that communicates with the atmospheric air outside the processing container 102 may be provided at the matching unit 114, and then the hole may be used as the communication channel 166.

In addition, as shown in FIG. 2, a gap may be provided at a connecting part of the matching unit 114 and the outside tube 124, and then the gap may be used as the communication channel 166. Specifically, a flange portion 170 is provided at the other end of the outside tube 124 of the feeder unit 120, and the flange portion 170 is engaged with the matching unit 114 via an engaging unit 172 such as a screw or a bolt. At that time, the engaging unit 172 is engaged with the matching unit 114 so loosely that a gap is formed between the flange portion 170 and the surface of the matching unit 114. In the case, the gap serves as the communication channel 166 between the hollow portion 162 and the atmospheric air.

In addition, as shown in FIG. 2, an air circulating unit 174 may be provided for forcibly generating air convection through the communication channel 164 of the processing container 102, the space portion 160 of the lower electrode unit 104, the hollow portion 162 of the feeder unit 120, and the communication channel 166. The air circulating unit 174 may be formed by a pump that supplies an air into the communication channel 164 or a pump that sucks an air. In these cases, cooling effects in the space portion 160 of the lower electrode unit 104 and in the hollow portion 162 of the feeder unit 120 can be improved.

In addition, when the above cooling-medium circulating unit 132 that cools the electrode part 146 of the lower electrode unit 104 is provided, dew formation tends to be caused on a surface of the RF feeder rod 122 in the space portion 160 of the lower electrode unit 104 and/or a surface of the processing container 102. Regarding this point, according to the embodiment, since the air convection is generated through the communication channel 164 and the communication channel 166 to the atmospheric air outside the processing container 102, the above dew formation may be prevented. Thus, surface transfer of radio frequency power, which may be caused by the dew formation on respective surfaces of elements in the space portion 160, can be prevented.

Especially, if the cooling medium of the cooling-medium circulating unit 132 flows through the space portion 160 of the lower electrode unit 104 and/or the hollow portion 162 of the feeder unit 120, the dew formation tends to be caused, so that the effect of preventing the dew formation by the above structure is important. In addition, the forcible convection by the air circulating unit 174 may improve more the effect of preventing the dew formation.

An oxide layer may be formed on the lower electrode, at least on the side of the space portion 160. In addition, an oxide layer may be formed on a bottom portion of the processing container 102, at least on the side of the space portion 160. For example, the oxide layer may be formed on the lower side of the electrode part 146. The oxide layer may be a film formed by a film-forming process. Alternatively, the oxide layer may be a film formed by an anodic oxidation of a surface of the lower electrode or a surface of the processing container.

In the above description, the preferred embodiment according to the invention is explained with reference to the attached drawings. However, needless to say, this invention is not limited to the embodiment.

For example, a plasma processing apparatus is not limited to the plasma etching apparatus explained in the embodiment. The invention can be applied to various plasma processing apparatuses such as another parallel plate plasma processing apparatus, a helicon-wave plasma apparatus, an inductively coupled plasma processing apparatus, or the like.

Next, with reference to the attached drawings, a plasma processing apparatus and feeder member thereof according to the present invention is explained in detail. In the specification and the drawings, elements that have substantially the same structure and function are represented by the same numeral sign, and overlapped explanation is omitted.

Figure 3:
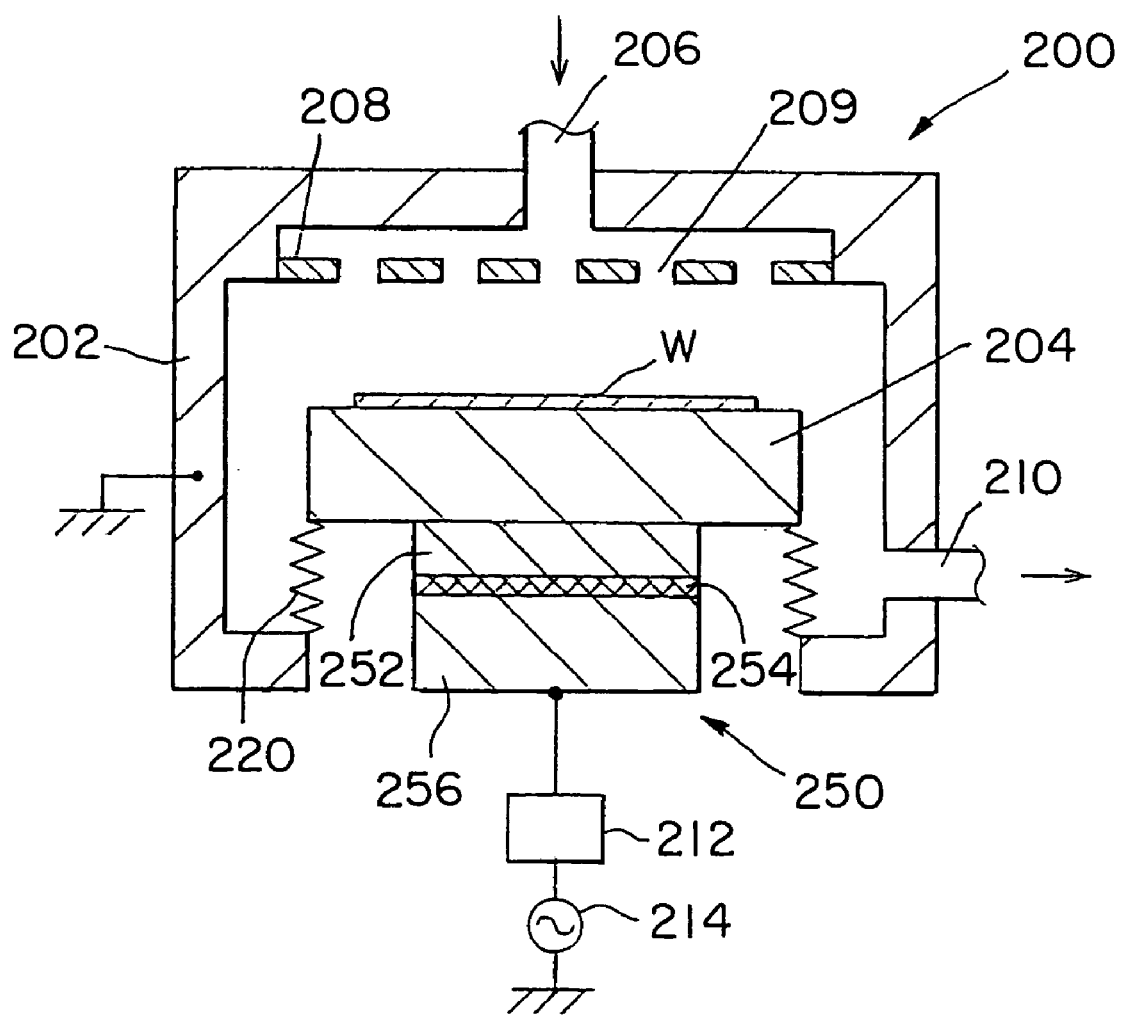
FIG. 3 is a schematic sectional view of a plasma etching apparatus according to another embodiment of the present invention.

FIG. 3 is a schematic sectional view of a plasma etching apparatus 200 as an example of a plasma processing apparatus, according to the embodiment. FIG. 4 is a schematic sectional view showing a feeder member 250. FIG. 5 is a schematic sectional view showing another feeder member 260.

As shown in FIG. 3, in the plasma etching apparatus 200, a semiconductor wafer W is arranged at a lower portion in an airtight and substantially cylindrical processing container 202, which is grounded. A lower electrode 204 that also serves as a stage is provided for example in a vertically movable manner. A bottom portion of the processing container 202 and a bottom portion of the lower electrode 204 are hermetically connected by a substantially cylindrical bellows 220. Thus, the inside of the processing container 202 is sealed.

An upper electrode 208 is provided to confront the lower electrode 204. The upper electrode 208 is grounded via the processing container 202. In the embodiment, a radio frequency power is applied only to the lower electrode 204. However, a radio frequency power may be applied to the upper electrode 208 as well.

A gas introducing port 206 connected to a gas-introducing system (not shown) is provided at an upper portion of the processing container 202. The process gas supplied from the gas introducing port 206 is introduced into the processing container 202 through a plurality of gas-ejecting ports 209 provided in the upper electrode 208.

An exhaust pipe 210 connected to a gas-discharging mechanism (not shown) is communicated to a lower portion of the processing container 202. The inside of the processing container 202 can be maintained at a predetermined vacuum level by producing a vacuum via the exhaust pipe 210. Magnets may be provided outside the both side walls of the processing container 202 so as to generate a magnetic field perpendicular to an electric field. In the case, it is preferable that the strength of the magnetic field by the magnets is changeable.

The lower electrode 204 is connected to a radio frequency power source 214 via a feeder member 250 and a matching unit 212. The frequency of the radio frequency power source 214 is for example 13.56 MHz.

Herein, the feeder member 250 is explained, which is also called a conductive rod (Hot Return). As shown in FIG. 2, the feeder member 250 having the feature of the present invention has three elements of conductors 252 and 256 and an insulator 254. The conductors 252 and 256 are made of a good conductive material whose electric resistance is low, such as aluminum, copper or the like, and has a substantially cylindrical shape having a bottom area A. The insulator 254 is made of a dielectric material whose thermal conductivity is low, and has a substantially cylindrical shape having a thickness d and a bottom area A. The conductors 252 and 256 and the insulator 254 may have a normal cylindrical shape, or a cylindrical shape including a plurality of cylindrical cavities.

In order to reduce loss of the radio frequency power by electrostatic coupling between the conductors 252 and 256, it is preferable that the capacitance of the feeder member 250 is large. The capacitance of the feeder member 250 is proportional to the dielectric constant and the bottom area A of the insulator 254, and inversely proportional to the thickness d. Thus, it is preferable that the dielectric constant and the bottom area A are as large as possible and that the thickness d is as thin as possible. The bottom area A is preferably as large as possible within an allowable range in designing the plasma processing apparatus 200, and the thickness d is preferably formed as thinly as possible within a range wherein the insulator 254 can be processed.

In addition, in order to interrupt thermal transfer between the lower electrode 204 and the conductor 256, it is preferable that the insulator 254 is made of a material whose thermal conductivity is low. As a material for the insulator 254, taking into consideration the dielectric constant and the thermal conductivity, alumina ceramics, bulk yttria, zirconia or the like may be used.

According to the above structure, since the insulator 254 is provided in the feeder member 250 that supplies the radio frequency power to the lower electrode 204, the heat transfer from the lower electrode 204 to the conductor 256 at a lower portion of the feeder member 250 can be interrupted while the radio frequency power of for example 10 MHz or higher can be transferred efficiently. Thus, danger in a maintenance operation, deterioration of operational efficiency, dew formation on a surface of the feeder member 250, or the like can be prevented.

In addition, as shown in FIG. 5, instead of the feeder member 250, another feeder member 260 may be used. The feeder member 260 has five elements of conductors 262, 266 and 270 and insulators 264 and 268.

As described above, the feeder member 250 or 260 for transferring the electric power from the radio frequency power source 214 to the lower electrode 204 has the insulator 254 or insulators 264 and 268, which have the effect of interrupting the heat transfer. Thus, the radio frequency power can be transferred efficiently to the lower electrode 204, and it can be prevented that the temperature (heat) of the lower electrode 204, which also serves as a temperature controller, is transferred to the lower portion of the feeder member 250 or 260. Thus, a process of heating the lower electrode 204 to 60° C. or more to etch poly-silicon, a process of controlling a low temperature of 0 to −20° C. to etch a silicon oxide film, and other various processes can be conducted safely and efficiently.

Figure 6:
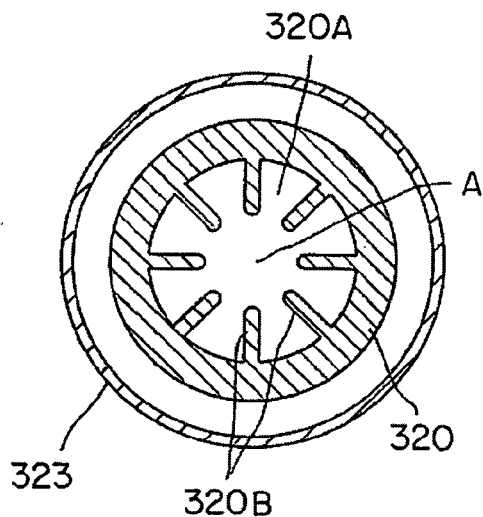
FIG. 6 is a sectional view showing a radio frequency feeder rod according to an embodiment of the present invention.
Figure 7:
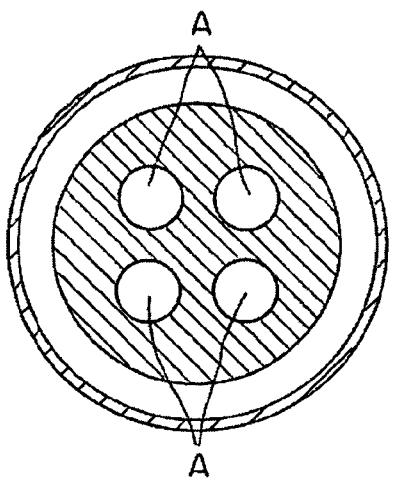
FIG. 7 is a sectional view showing another embodiment of a radio frequency feeder rod.

Next, a radio frequency feeder rod of the present invention is explained based on sectional views shown in FIGS. 6 and 7.

Figure 8:
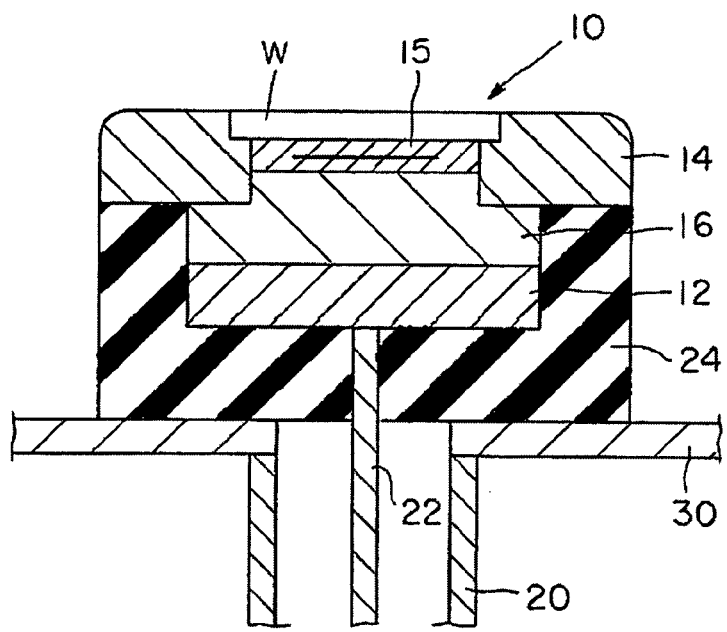
FIG. 8 is a schematic sectional view of a conventional electrode unit.

For example, the radio frequency feeder rod of the invention can be applied to a plasma processing apparatus shown in FIG. 8. That is, instead of the RF feeder rod 22 of FIG. 8, a radio frequency feeder rod 320 of the invention can be used. A radio frequency power is supplied from a radio frequency power source to the electrode part 12 via the radio frequency feeder rod 320. For example, as shown in FIG. 6, the radio frequency feeder rod 320 is shielded by a shield pipe 323, from an outside thereof. The shield pipe 323 has a function of shielding the radio frequency feeder rod 320 from the outside thereof and being at ground potential. That is, the shield pipe 323 is a member corresponding to the outside tube 20 of FIG. 8.

The radio frequency feeder rod 320 of the embodiment is formed by a conductive rod having a flow path 320A through which a cooling medium (for example, an air) A flows. In addition, the radio frequency feeder rod 320 of the embodiment has an area expanding unit for expanding an area of absorption of heat by the air A. The area expanding unit of the embodiment is formed in the axial direction as a plurality of finlike protrusions 320B that protrude into the flow path 320A. The finlike protrusion 320B has a much larger area contacting with the air flowing through the flow path 320A (area of absorption of heat) than that of a conventional flow path. Thus, the radio frequency feeder rod 320 can be efficiently cooled from the inside thereof. Thus, overheat of the radio frequency feeder rod 320 can be prevented. In the embodiment, an outside surface of the radio frequency feeder rod 320 is maintained at a circle shape, and the finlike protrusions 320B protrude into the flow path 320A.

When the radio frequency feeder rod 320 is manufactured, for example, a flat plate having the finlike protrusions 320B is made from a thick plate by a cutting operation, then the flat plate is rolled into a hollow rod, and then both edges thereof are bonded to each other by a welding or the like.

When the radio frequency power is applied from the radio frequency power source to the electrode part 12, a radio frequency electric current may flow along each surface of the radio frequency feeder rod 320. At that time, the temperature of the radio frequency feeder rod 320 is going to rise according to the radio frequency resistance. However, since the air for cooling flows into the flow path 320A, the temperature rise of the radio frequency feeder rod 320 is inhibited. In particular, since the finlike protrusions 320B are formed in the flow path 320A of the radio frequency feeder rod 320, the area of absorption of heat by the air is so large that the radio frequency feeder rod 320 can be efficiently cooled even when the radio frequency power is great. That is, respective overheat can be prevented.

As described above, according to the embodiment, since the finlike protrusions 320B that protrude into the flow path 320A of the radio frequency feeder rod 320 are provided, the area of absorption of heat by the air can be large. Thus, the cooling efficiency by the air can be remarkably improved, and overheat of the radio frequency feeder rod 320 can be prevented. In particular, even when the wafer W is enlarged, density of the plasma process is made higher, and thus the radio frequency power is increased, overheat of the radio frequency feeder rod 320 can be prevented, and the plasma process can be conducted smoothly.

In the above embodiment, the finlike protrusions 320B are explained as an area expanding unit of the present invention. However, it is not limited to the finlike protrusion 320B, if it protrudes into the flow path 320A. For example, sticklike (or needlelike) protrusions or pleat-like protrusions may protrude over the whole surface of the flow path. In addition, as shown in FIG. 7, a plurality of flow paths may be formed in lotus-root-hole shapes and arranged in parallel. Each of the plurality of flow paths may have one or more protrusions. In addition, a cooling medium such as an air may be caused to flow between the radio frequency feeder rod and the shield pipe. The cooling medium is not limited to the air, but any suitable cooling medium may be selected as required. The object to be processed is not limited to the wafer. The radio frequency feeder rod of the invention can be applied to not only the parallel plate plasma processing apparatus but also any other plasma processing apparatus using a radio frequency power. In addition, it can be also applied to a general feeder rod for a radio frequency power.

The invention claimed is:

1. A plasma processing apparatus that introduces a process gas into an airtight and grounded processing container, that applies a radio frequency power to generate plasma, and that conducts a plasma process to an object to be processed arranged in the processing container, the plasma processing apparatus comprising:
   an electrode unit arranged in the processing container, the electrode unit having an electrode for applying the radio frequency power,
   a space portion arranged in the electrode unit, the space portion insulating the electrode and the processing container from each other, and
   a first communication channel and a second communication channel that communicate with the space portion and outside the processing container such that air flows from one of the first communication channel and the second communication channel to the other of the first communication channel and the second communication channel through the space portion in order to prevent dew formation in the space portion.

2. A plasma processing apparatus according to claim 1, wherein
   an oxide layer is formed on a surface of the electrode at least on the side of the space portion.

3. A plasma processing apparatus according to claim 1, wherein
   an oxide layer is formed on a surface of the processing container at least on the side of the space portion.

4. A plasma processing apparatus according to claim 1, further comprising
   a feeder unit projected from an outside surface of the processing container, the feeder unit supplying the radio frequency power to the electrode of the electrode unit,
   wherein the feeder unit has an impressing member for impressing the radio frequency power and a ground member surrounding the impressing member, the impressing member being electrically connected to the electrode, the ground member being electrically connected to the processing container,
   a hollow portion is formed between the impressing member and the ground member, and the hollow portion is communicated to the space portion in the electrode unit.

5. A plasma processing apparatus according to claim 4, wherein
the feeder unit has a communication channel from the hollow portion in the feeder unit to the atmospheric air outside the processing container.

6. A plasma processing apparatus according to claim 5, wherein
the ground member is connected to a matching unit, and
the communication channel is provided in a vicinity of a connection part of the matching unit and the ground member.

7. A plasma processing apparatus according to claim 5, further comprising
a cooling-medium circulating unit that circulates a cooling medium through the electrode of the electrode unit to cool it.

8. A plasma processing apparatus according to claim 5, further comprising
an air circulating unit that circulates the atmospheric air outside the processing container through the space portion of the electrode unit and the hollow portion of the feeder unit.

9. An electrode unit arranged in an airtight and grounded processing container of a plasma processing apparatus, the plasma processing apparatus introducing a process gas into the processing container, and applying a radio frequency power to conduct a plasma process to an object to be processed, the electrode unit comprising:
an electrode to which the radio frequency power is impressed,
a space portion that insulates the electrode and the processing container from each other, and
a first communication channel and a second communication channel that communicate with the space portion and outside the processing container such that air flows from one of the first communication channel and the second communication channel to the other of the first communication channel and the second communication channel through the space portion in order to prevent dew formation in the space portion.

10. An electrode unit according to claim 9, wherein
an oxide layer is formed on a surface of the electrode at least on the side of the space portion.

11. An electrode unit according to claim 9, wherein
a feeder unit projected from an outside surface of the processing container is adapted to supply the radio frequency power to the electrode,
the feeder unit has an impressing member for impressing the radio frequency power and a ground member surrounding the impressing member, the impressing member being electrically connected to the electrode, the ground member being electrically connected to the processing container,
a hollow portion is formed between the impressing member and the ground member, and
the hollow portion is communicated to the space portion.

12. An electrode unit according to claim 11, wherein
the feeder unit has a communication channel from the hollow portion in the feeder unit to the atmospheric air outside the processing container.

13. An electrode unit according to claim 12, wherein
the ground member is connected to a matching unit, and
the communication channel is provided in a vicinity of a connection part of the matching unit and the ground member.

14. An electrode unit according to claim 12, further comprising
a cooling-medium circulating unit that circulates a cooling medium through the electrode to cool it.

15. An electrode unit according to claim 12, further comprising
an air circulating unit that circulates the atmospheric air outside the processing container through the space portion and the hollow portion of the feeder unit.

16. A feeder member arranged in a plasma processing apparatus; the plasma processing apparatus introducing a process gas into an airtight processing container, applying a radio frequency power to generate plasma of the process gas, and conducting a plasma process to an object to be processed; the feeder member electrically connecting a radio frequency power source that generates the radio frequency power and an electrode to which the radio frequency power is impressed; the feeder member comprising:
a first member made of a conductive material, and
a second member interposed in the first member and made of dielectric ceramics.

17. A feeder member according to claim 16, wherein
the second member is interposed in the first member as a layer.

18. A feeder member according to claim 16, wherein
the second member is made of any of alumina ceramics, bulk yttria or zirconia.

19. A plasma processing apparatus that introduces a process gas into an airtight processing container, that applies a radio frequency power to generate plasma of the process gas and that conducts a plasma process to an object to be processed,
wherein a feeder member according to claim 16 is provided.

20. A plasma processing apparatus that introduces a process gas into an airtight processing container, that applies a radio frequency power to generate plasma, and that conducts a plasma process to an object to be processed arranged in the processing container, the plasma processing apparatus comprising:
an electrode unit arranged in the processing container, the electrode unit having an electrode for applying the radio frequency power, and
a space portion arranged in the electrode unit, the space portion insulating the electrode and the processing container from each other,
wherein the space portion communicates with outside the processing container through a first communication channel and a second communication channel, such that air flows from one of the first communication channel and the second communication channel to the other of the first communication channel and the second communication channel through the space portion in order to prevent dew formation in the space portion, and
an oxide layer is formed on a surface of the electrode at least on the side of the space portion.

21. A plasma processing apparatus that introduces a process gas into an airtight processing container, that applies a radio frequency power to generate plasma, and that conducts a plasma process to an object to be processed arranged in the processing container, the plasma processing apparatus comprising:
an electrode unit arranged in the processing container, the electrode unit having an electrode for applying the radio frequency power, and a space portion arranged in the electrode unit, the space portion insulating the electrode and the processing container from each other, wherein the space portion communicates with outside the processing container through a first communication channel and a second communication channel, such that air flows from one of the first communication channel and the second communication channel to the other of the first communication channel and the second communication channel through the space portion in order to prevent dew formation in the space portion, and an oxide layer is formed on a surface of the processing container at least on the side of the space portion.

22. A plasma processing apparatus that introduces a process gas into an airtight and grounded processing container, that applies a radio frequency power to generate plasma, and that conducts a plasma process to an object to be processed arranged in the processing container, the plasma processing apparatus comprising:

an electrode unit arranged in the processing container, the electrode unit having an electrode for applying the radio frequency power, and a space portion arranged in the electrode unit, the space portion insulating the electrode and the processing container from each other, wherein the electrode unit is unmovable in a vertical direction, the space portion is separated from a process space in which the plasma is generated, and the space portion is partly formed by a bottom wall of the processing container.

23. A plasma processing apparatus according to claim 22, wherein a first communication channel and a second communication channel are provided so as to communicate with the space portion and outside the processing container.

24. A plasma processing apparatus according to claim 23, wherein air flows from one of the first communication channel and the second communication channel to the other of the first communication channel and the second communication channel through the space portion.

25. A plasma processing apparatus according to claim 22, wherein the space portion extends downward at a central portion thereof compared with a peripheral portion thereof.

* * * * *

UNITED STATES PATENT AND TRADEMARK OFFICE
CERTIFICATE OF CORRECTION

PATENT NO. : 7,230,202 B2  Page 1 of 1
APPLICATION NO. : 10/927587
DATED : June 12, 2007
INVENTOR(S) : Daisuke Hayashi et al.

It is certified that error appears in the above-identified patent and that said Letters Patent is hereby corrected as shown below:

On the title page, left column, please insert:

--(60), Related U.S. Application Data
Continuation of Application No. PCT/JP03/02381, filed on February 28, 2003--

--(30), Foreign Priority Data
February 28, 2002    (JP) ............................................. 2002-054202
February 28, 2002    (JP) ............................................. 2002-054225
March 26, 2002       (JP) ............................................. 2002-085303
January 15, 2003     (JP) ............................................. 2003-006943--

Signed and Sealed this

Twenty-ninth Day of July, 2008

JON W. DUDAS
*Director of the United States Patent and Trademark Office*